April 27, 1965 E. P. STABLER 3,181,002
PARAMETRIC SUBHARMONIC OSCILLATOR UTILIZING A VARIABLE SUPERCONDUCTIVE CORE INDUCTANCE
Filed June 20, 1960 3 Sheets-Sheet 1

INVENTOR:
EDWARD P. STABLER,
BY Dudley T. Ready
HIS AGENT.

April 27, 1965 E. P. STABLER 3,181,002

PARAMETRIC SUBHARMONIC OSCILLATOR UTILIZING A VARIABLE SUPERCONDUCTIVE CORE INDUCTANCE

Filed June 20, 1960 3 Sheets-Sheet 2

INVENTOR:
EDWARD P. STABLER,

BY Dudley T. Ready
HIS ATTORNEY.

INVENTOR:
EDWARD P. STABLER,

BY Dudley T. Ready
HIS ATTORNEY.

United States Patent Office
3,181,002
Patented Apr. 27, 1965

3,181,002
PARAMETRIC SUBHARMONIC OSCILLATOR UTILIZING A VARIABLE SUPERCONDUCTIVE CORE INDUCTANCE

Edward P. Stabler, North Syracuse, N.Y., assignor to General Electric Company, a corporation of New York
Filed June 20, 1960, Ser. No. 37,356
6 Claims. (Cl. 307—88)

The present invention relates to a subharmonic oscillator for alternating current waves and has as an object thereof to provide a parametric oscillator. The present invention further provides a novel parametric inductor having a variable reactance characteristic utilizing a superconductive member. The oscillator has utility in computer systems and the like such as described in the Proceedings of the IRE, volume 47, No. 4, pp. 516–523, April 1959 ("A New Concept in Computing," by R. L. Wigington) and Proceedings of the IRE, volume 47, No. 8, pp. 1304–1316, August 1959 ("The Parametron, a Digital Computing Element Which Utilized Parametric Oscillation," by E. Goto).

The above cited articles of E. Goto and R. L. Wigington describe computing systems which utilize sinusoidal signals coded in zero and $\pi$ phases to represent binary digits. The basic unit of these systems is a subharmonic parametric oscillator which takes the form of a tank circuit resonant at the frequency of the coded signals. One of the reactive elements (ferrite cores in the former and parametric diodes in the latter) is nonlinear and when an exciting current at an integral multiple of the signal frequency is applied from a pumping source to the nonlinear reactive element, parametric oscillation occurs at either phase, as described in these articles. This makes possible the amplification and storage of a binary sinusoidal signal which is applied to the oscillator. When logic circuits are interposed between one or more oscillators and a succeeding oscillator, computer operations can be performed. The exciting current is applied intermittently to an oscillator for a period corresponding to the computer operation frequency. That is, the current is applied for a computer cycle that typically covers several tens of cycles of the exciting current during which time the oscillation in the parametric oscillator builds up.

The oscillators produced in accordance with the prior art teachings have had certain disadavantages. The variable reactance elements used (ferrite cores and parametric diodes) have required circuit configurations in which the excitation or pumping current signal is introduced into the resonant circuit of the oscillator. This entails extra filtering networks or duplication of structure in balancing out the excitation current from the output. The circuits have also been found difficult to fabricate in small sizes cheaply with reliability. The ferrites and diodes utilize ferromagnetic and semiconductor phenomena, respectively, which are nonlinear in character.

Another set of nonlinear phenomena is presented by superconductive materials at temperatures near absolute zero. In these materials, the most widely known characteristic is the infinite conductivity of the materials at low temperatures. In addition to this property, these materials exhibit the Meissner effect. That is, the superconductive state is accompanied by zero permeability and when a material is in the superconductive state, it can be forced into a normal conductive state by a magnetic field of sufficient magnitude. The minimum field required is the "critical field," as hereinafter referred to, and it is a function of the material and the temperature. In view of this large variation in magnetic properties, as one makes a transition from the normally conductive to the superconductive state, and vice versa, one may utilize this principle in inductive structures to achieve a great variation in reactance. The non-linearity of reactance with applied current is then the basis for parametric amplification.

It is an object of the present invention to provide an improved parametric device employing a superconductive material and useful as a bistable element.

It is a further object of this invention to provide improved parametric subharmonic oscillators which are easily miniaturized, of cheap construction and of extremely high reliability.

It is a further object of this invention to provide an improved parametric subharmonic oscillator which utilizes the magnetic properties of superconductive materials in providing the nonlinear reactance.

It is a further object of this invention to provide a novel variable reactance element utilizing superconductor materials.

Briefly stated, in accordance with one aspect of the invention, the variable permeability of a superconductive material is utilized to provide a parametric variation in the inductive reactance of a tank circuit. The resonant circuit tuned to the frequency of the input signal is comprised of a capacitance and a coil, in parallel, in which the coil surrounds a core of superconductive material. Excitation or pumping means are provided to create a periodic magnetic field in said core whose periodicity is a multiple of the signal frequency. The permeability of the core is thereby varied at a multiple of the signal frequency and the coil inductance therewith. If a signal, of either 0 or $\pi$ phase and which is a subharmonic of the excitation current, is applied across the resonant circuit, a parametric oscillation with the same phase will be developed.

The invention will be better understood from the following description taken in connection with the accompanying drawing and its scope will be pointed out in the appended claims.

Figure 1:
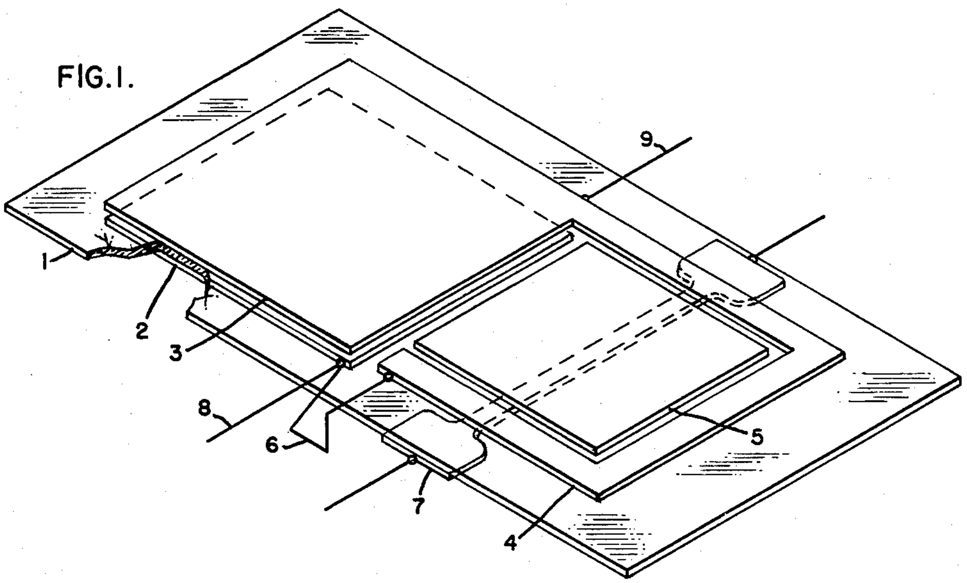
FIGURE 1 illustrates a subharmonic oscillator constructed in accordance with the invention.

The preferred construction of the subharmonic oscillator in accordance with the invention is illustrated in the embodiment of FIGURE 1. The oscillator circuit is constructed on a circuit board by a suitable printed circuit technique. The board 1 is a very thin sheet of dielectric material, conveniently glass, approximately 0.02 mm. in thickness. The tank circuit is preferably formed thereon by printing niobium or some other superconductive material which requires a relatively high critical field or temperature to force it into the normal conducting state. By printing plate areas 2 and 3 on opposing sides of the board, a tank capacitor is produced.

The tank coil is produced by printing an extension arm 4 from a corner of the plate 3 which extends in the shape of a U in which the other end of the arm is near, but separated from, the adjacent corner of the same plate 3. The coil encloses a core element 5 produced by printing lead or some other superconductive material which requires relatively small critical fields to force it into the normal conducting and normal permeability state. The tank circuit is completed by welding a copper lead 6 to the end of the coil arm and to the other plate 2 and providing input-output terminal leads 8 and 9 welded to the plates 2 and 3, respectively. In addition to the tank circuit, an excitation strip 7 is printed on the board 1 on the side opposite to the core 5 and in alignment therewith for producing a magnetic field which forces the core into the normal permeability state periodically.

For operation with coded signals at 50 mc., suitable dimensions would be 5 cm. by 2.5 cm. for the circuit of FIGURE 1. With the capacitor plates 2 and 3 being 2.5 cm. square and the lead core 5 being in the normal conductive state, the tank circuit will be resonant at 50 mc. The niobium will always be operated in the superconductive region and therefore it is necessary to use a narrow configuration for the excitation strip 7 in order to prevent the shielding effect of its zero permeability from affecting the inductance of the tank circuit. Both the niobium and lead are conveniently printed on the board 1 by conventional vapor deposition through masks to a suitable thickness of .02 mm. For the typical tank circuit specified above, the coil arm 4 would be approximately 5 mm. in width. If the spacing between the arm and the core 5 is maintained at one tenth or less of the arm width, ample variation in the inductance is obtained. Conventional arrangements for obtaining low temperatures are suitable and are thus not illustrated. For example, a temperature of 4.2° K. is obtained by operation in a bath of liquid helium.

Figures 2, 3A:
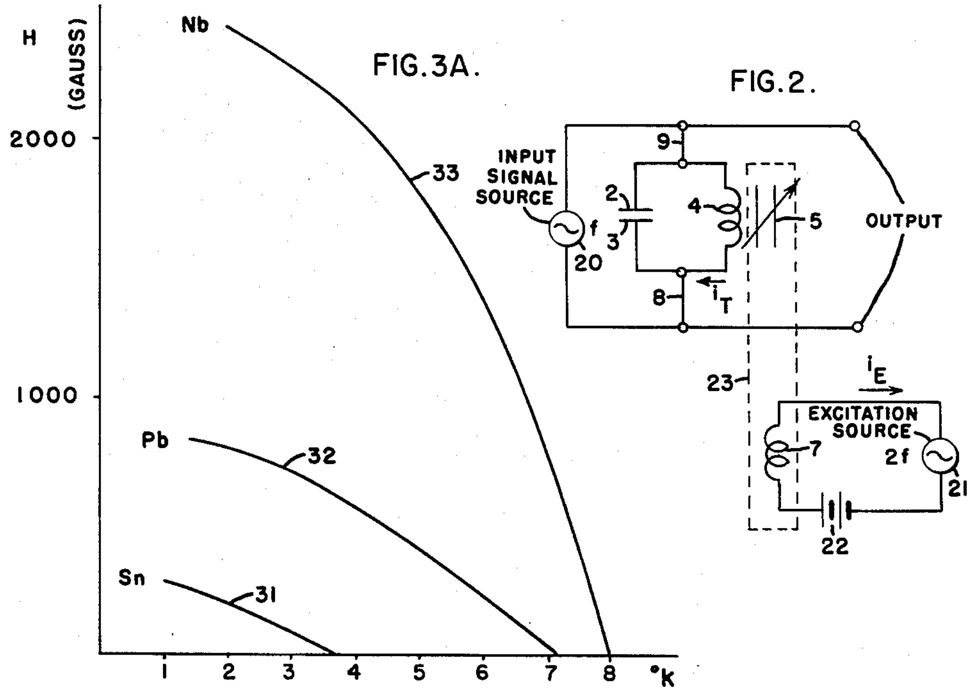
FIGURE 2 is the circuit of FIGURE 1 presented in schematic form.
FIGURE 3A is a graph of critical field strength against temperature for three representative superconductive materials.

FIGURE 2 is a schematic representation of the circuits shown in FIGURE 1 with the same reference characters designating the corresponding components of the tank circuit. If an input signal in the form of pulses coded in phase of a given frequency $f$ from source 20 is applied across the tank circuit at terminal leads 8 and 9 an oscillation of small amplitude will be produced in the tank circuit comprised of the inductor 4 and the parallel capacitor 2, 3. If the excitation strip 7 is connected to an excitation source 21 of reference phase and frequency $2f$ of excitation current, $i_E$, and a series bias source 22, in phase with the tank current, $i_T$, the oscillation will be built up to a high level. The bias is sufficient to produce a current which results in a magnitic field in the core 5 (the coupling is indicated by the dash line 23) at the critical intensity that separates a superconductive material from the region of normal permeability and the superconducting state. Therefore, as the source 21 varies the field intensity in the core, the core passes through successive transitions from zero permeability to normal permeability and from normal permeability to zero permeability state. The net effect is a build-up of the oscillation in the tank circuit. Accordingly, a signal is available as the output through the input-output terminal leads 8 and 9 which is essentially an amplified version of the input signal applied from source 20 and retaining the phase coding.

The arrangement of FIGURE 2 functions as a parametric oscillator whose state is indicative of the applied information. The source of energy for operating the oscillator is from an excitation source 21, whose phase is chosen as the reference phase and whose frequency is twice that of the input signal. Applicant's arrangement is unconventional however, in that the insertion of pumping energy is not by direct electrical transfer but rather indirectly by virtue of a field induced change in state of the core 5. This change in state reduces the signal created field in the tank circuit, a process requiring energy of the pump. Thus it is that an intermediate change in state energy conversion is required in the transfer. The input signal of frequency $f$ is applied to the tank circuit coded in phase to have either a reference or $\pi$ phase coincident with the zero cross-overs of the excitation source 21.

From this frequency and phase relationship it may be seen that the pump will sustain oscillations at a high level at either input signal condition. The function of the circuit thus is analogous to that of a flip flop, wherein it has two stable states, evidenced by the phase of operation, at the signal frequency, to which it is driven in accordance with the phase coding on the input signal.

The onset and termination of a stored pulse are graphically illustrated in FIGURES 4A and 4B as further explained below. Since, the oscillator operates with considerable stability, at its terminal condition, switching in this condition would require as much signal energy as that delivered from the pump.

Accordingly, it is necessary that the signal energy be introduced into the oscillator at a time prior to a substantial build up of energy as a result of the excitation source. This may be achieved conveniently by pulsing the excitation source in synchronism with the pulsing of the input signal. In this way the signal arrives simultaneously with the excitation energy, and a relatively low magnitude signal will control the ultimate phase of the oscillation. If the signal entry is progressively delayed, the signal level will have to be undesirably increased, so this delay should be avoided.

In terminating the storage of the pulse, means are provided for quenching the pulse to a sufficiently low value such that the signal from the succeeding pulse will have control. A suitable arrangement for achieving such quenching is illustrated in FIGURE 2, wherein the excitation source provides a short deexcitation pulse, displaced 180° in phase from the pump reference phase, and having a duration such as to bring the system into a low energy state, at the onset of the new signal pulse.

Figure 4A:
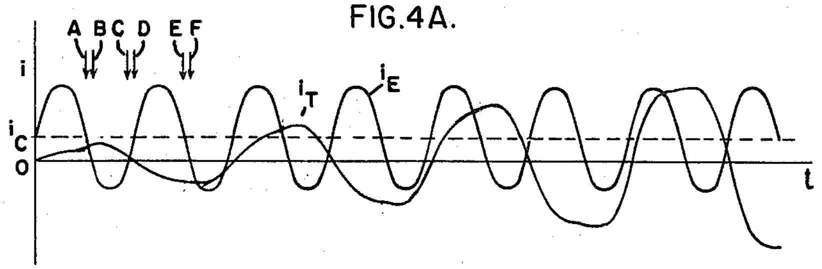
FIGURE 4A is a graph of excitation current and tank current against time for a build up of oscillation in the tank circuit.

FIGURE 4A is a presentation of the tank current in the pulse initiation period, $i_T$, and excitation current, $i_E$, plotted against time. As the excitation current $i_E$ decreases from the point A to point B the tank core 5 becomes superconductive as the excitation field becomes insufficient to force the core into the normal permeability state. Precisely the same transition occurs from point E to point F and the reverse transition from superconducting to normal permeability occurs from point C to point D. The transitions at $i_T=0$ have no effect, but the transitions from A to B and E to F result in a build up of the oscillation in the tank circuit to increasing magnitudes of current. Since the tank circuit elements are always superconducting there are small resistive losses, and the amplitude of the current $i_T$ reaches a maximum determined by the asymptotic approach of the rate of loss to the rate of energy pumped into the tank circuit.

Figure 4B:
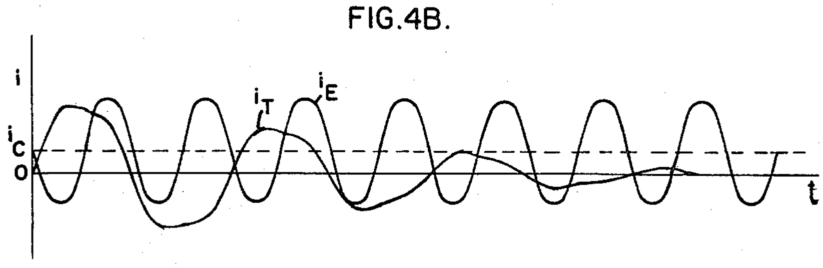
FIGURE 4B is a graph of an excitation current 180° out of phase with the excitation current of FIGURE 4A and the tank current against time for a dissipation of the tank circuit oscillation.

FIGURE 4B is a presentation of $i_E$ and $i_T$ as functions of time in the pulse termination period, where the phase of the excitation current, $i_E$, is displaced 180° in time relative to $i_E$ in FIGURE 4B. This results in the transitions from normal permeability to the superconducting state and from the superconducting state to normal permeability being mutually reversed. Now the transitions to the superconducting state occur when $i_T=0$ and therefore have no effect. However, the transitions from point C to point D occur at the maximum and minimum values of $i_T$ and at these transitions, energy is absorbed from the tank circuit. The effect is that the oscillation in the tank circuit is gradually diminished. As explained above, this mode of operation has utility in quenching the tank oscillation, thereby permitting the application of a new input signal to the subharmonic oscillator.

As shown in FIGURES 4A and 4B, the parametric oscillator absorbs or discharges energy during the transitions of the inductor core between the superconductive and normally conductive states. These transitions produce regions of non-linearity in the inductance parameter of the parametric oscillator. Through this non-linear reactance phenomenon, which is excited in the proper time relationship to the oscillations in the resonant circuit, the parametric oscillation mechanism is realized.

Figure 5A:
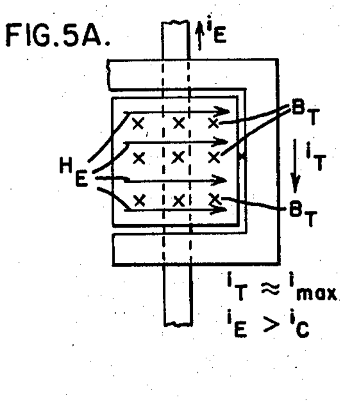
FIGURES 5A, 5B, 5C, 5D, 5E and 5F are successive plan view diagrams of the electrical, magnetic and physical states of the tank inductor for the corresponding points in time indicated in FIGURE 4A.
Figure 5B:
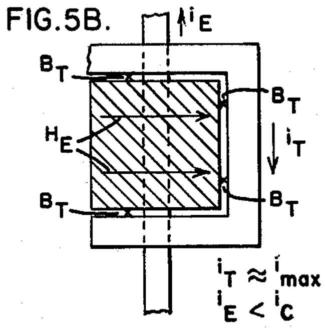
Figure 5C:
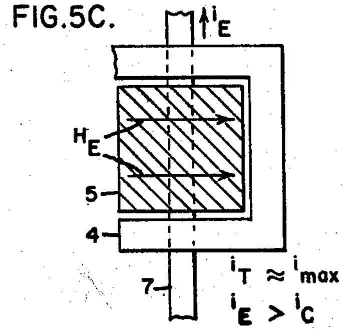
Figure 5D:
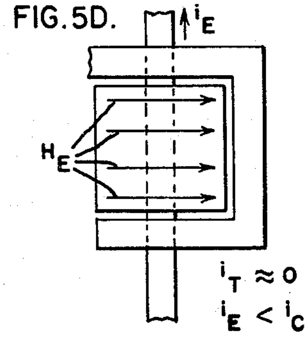
Figure 5E:
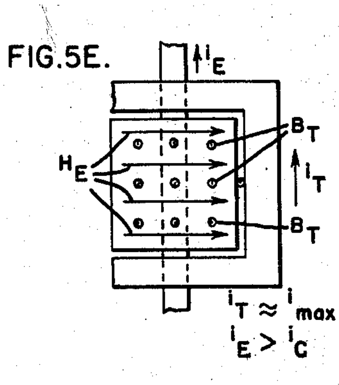
Figure 5F:
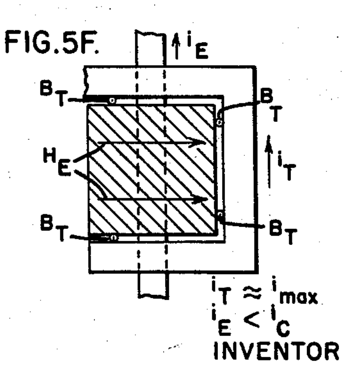

FIGURES 5A, 5B, 5C, 5D, 5E and 5F illustrate the conditions in the inductor at points A–F in the operating cycle of the tank circuit as shown in FIGURE 4A. In each figure, the coil arm, core and excitation strip is shown at 4, 5 and 7, respectively. At point A the excitation current $i_E$ is above the amplitude necessary to produce the critical field and the core is accordingly in the normal permeability state. The current in the tank circuit, $i_T$, at point A is near the maximum. Since the core is in the normal permeability state, this high current is accompanied by a high flux density as can be seen from the large number of flux lines, $B_T$, perpendicular to the plane of the drawing. As the current $i_E$ decreases to the value at point B, the magnetic intensity falls below the critical value and the core becomes superconductive as represented by the shade lines on core 5 in FIGURE 5B. Under these conditions, the flux lines $B_T$ are forced out of the core and results in an enhanced value of $i_T$. As can be seen in FIGURES 5C and 5D, the core is transformed from superconducting to normal permeability states as the current $i_E$ increases from point C to point D and the magnetic intensity $H_E$ exceeds the critical field intensity. Under these conditions, it is possible for energy in the tank circuit to take the form of a magnetic field through the core. Since there is no current flowing in the coil arm 4, this does not occur, and this transition has no overall effect on the energy in the tank circuit. As seen in FIGURES 5E and 5F, the excitation current $i_E$ decreases from the value shown at E to the value shown at F in FIGURE 4A. This change from normal permeability to superconducting state in the core 5 is the same as occurs in FIGURES 5A and 5B. The result is that the current $i_T$, near its negative maximum value, is enhanced in magnitude.

FIGURE 3A is a graph of the critical field of magnetic intensity at the transition between normal and superconducting states against temperature for representative bulk materials. For tin and lead (curves 31 and 32, respectively), at temperatures above 1° K., the transition is made with fields less than 1000 gauss. A plot of B, magnetic induction, versus H, magnetic intensity, for a bulk material results in a discontinuous relation between the two variables. For increasing H up to the critical value $H_C$, there is no flux produced, but for values above $H_C$, the relation of B to H is that of normal permeability. The boundary which is abrupt for bulk materials is not sharply defined for the thin films of the type produced in accordance with the preferred embodiment of the invention.

Figure 3B:
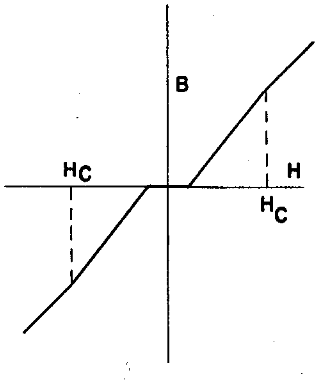
FIGURE 3B is a graph of magnetic induction, B, against magnet intensity, H, for a thin film.

As shown in FIGURE 3B, the relation of B to H for a thin film is that of a substantial region of transition. At a low value of H, around 10 oersteds, flux can be seen to be introduced in the material. As the magnetic intensity is increased, the flux, B, increases until $H_C$. Above this value, the relation of B to H is normal. That is, the relation of magnetic induction to magnetic intensity is linear in that the slope of the function is constant above the critical magnetic intensity. The variation of the relation of B to H from the straight line function for magnetic intensities less than $H_C$ produces the non-linear reactance of a coil element which includes a core having this non-linear permeability characteristic. In addition to lowering the critical magnetic field strength, the thin film construction minimizes eddy current losses.

It is to be understood that the invention is not to be considered limited to the specific embodiments disclosed. One may employ other arrangements wherein a member exhibiting the Meissner effect is utilized to control the inductive reactance of an inductor in parametrically operated arrangements. The true scope of the invention including those variations apparent to one skilled in the art is defined in the following claims.

What is claimed is:

1. In a parametric device: a resonant circuit structure having an inductance property, a superconductive magnetic member in flux linking relationship therewith, means for applying a phase coded signal to said resonant circuit structure, and means for producing a change in the state of said magnetic member so as to drive said member in and out of said superconductive state at twice the frequency of said signal so as to provide parametric interaction.

2. A parametric subharmonic oscillator comprising: a dielectric circuit board; an opposing pair of capacitor plates printed on said circuit board, a coil member printed on said circuit board; a core element consisting of a superconductive material printed on said circuit board in such a manner as to provide a shield which reduces the inductance of said coil member when said core element is superconductive; means interconnecting said capacitor plates and said coil member to form a tank circuit; and an excitation strip printed on said circuit board in such a manner as to provide means for forcing said core element into a higher permeability state when an excitation current is applied to said strip to produce a magnetic field in said core element exceeding the critical field strength.

3. A parametric subharmonic oscillator comprising: a dielectric circuit board; an opposing pair of capacitor plates consisting of a first thin superconductive material requiring a relatively high critical field to be forced into normal conduction printed on said circuit board; a coil arm member printed on said circuit board consisting of said first superconductive material and extending from one of said plates in a U shape configuration; a core element consisting of a second thin superconductive material requiring a relatively low critical field to be forced into normal conduction printed on said circuit board in such a manner as to substantially cover the surface within said coil member and separated therefrom by a distance on the order of one tenth or less of the width of said coil member, said circuit board, capacitor plates, coil member and core element being of dimensions suitable to provide circuit elements parallel resonant at a desired frequency when said core element is in the normal conduction state; means connecting said capacitor plates and said coil member to form a resonant tank circuit and provide input-output terminal connections; and a narrow excitation strip consisting of said first superconductive material printed on said circuit board in such a manner as to provide means for forcing said core into a higher permeability state when an excitation current is applied to said strip to produce a magnetic field in said core element exceeding the critical field strength.

4. A parametric subharmonic oscillator comprising: a capacitor; a superconductive core; a coil proximate and in flux linking relationship with said core; means connecting said capacitor and said coil in parallel and providing input-output terminal leads to form a tank circuit resonant at a given frequency when said core is forced into a normal permeability state; and means for creating a periodic magnetic field in said core to force said core from the superconductive to a relatively high permeability state at an integral multiple of said given frequency in such a manner as to provide parametric oscillation at said given frequency.

5. A parametric oscillator comprising: a capacitor; a superconductive core of a thin layer construction; a coil in flux linking relationship with said core; means connecting said capacitor and said coil in parallel and providing input-output signal terminal leads to form a tank circuit resonant at a given frequency when said core is forced into a relatively high permeability state; means for applying a phase coded signal of said given frequency across said tank circuit, and means for creating a periodic magnetic field to force said core from the superconductive to a relatively high permeability state at twice said given frequency in such a manner as to provide parametric oscillation in accordance with said phase coded signal.

6. A variable reactance component comprising: a dielectric circuit board; a thin superconductive film strip printed thereon forming an inductance; a thin core member of superconductive material also printed on said circuit board to a width greater than the width of said inductance strip, to a length substantially coextensive therewith, and separated from said inductance strip by a distance on the order of one tenth of said strip width, and a thin superconductive excitation strip printed on said plate in such a manner as to provide a critical magnetic field in said core member to force said core into the normal conducting state when an excitation current is applied to said strip.

References Cited by the Examiner

UNITED STATES PATENTS

| | | | |
|---|---|---|---|
| 2,659,868 | 11/53 | Ericsson et al. | 340—173.1 |
| 2,725,474 | 11/55 | Ericsson et al. | 340—173.1 |
| 2,815,488 | 12/57 | Von Neumann | 307—88 |
| 2,838,687 | 6/58 | Clary | 307—88 |
| 2,948,818 | 8/60 | Goto | 307—88 |

OTHER REFERENCES

Publication I, "Superconductivity," by "Cathode Ray" Wireless World, July 1957, pp. 326–330.

IRVING L. SRAGOW, *Primary Examiner.*